(12) United States Patent
He et al.

(10) Patent No.: US 11,988,925 B2
(45) Date of Patent: May 21, 2024

(54) DRIVING BACKPLATE, A MANUFACTURING METHOD THEREOF AND A DISPLAY MODULE

(71) Applicants: Hefei Xinsheng Optoelectronics Technology Co., Ltd., Anhui (CN); BOE TECHNOLOGY GROUP CO., LTD., Beijing (CN)

(72) Inventors: Min He, Beijing (CN); Jing Wang, Beijing (CN); Xiaodong Xie, Beijing (CN); Tianyu Zhang, Beijing (CN); Xue Zhao, Beijing (CN); Tengfei Zhong, Beijing (CN); Xinxiu Zhang, Beijing (CN); Huayu Sang, Beijing (CN); Feng Qu, Beijing (CN)

(73) Assignees: Hefei Xinsheng Optoelectronics Technology Co., Ltd., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 344 days.

(21) Appl. No.: 17/432,557

(22) PCT Filed: Oct. 28, 2020

(86) PCT No.: PCT/CN2020/124410
§ 371 (c)(1),
(2) Date: Aug. 20, 2021

(87) PCT Pub. No.: WO2022/087892
PCT Pub. Date: May 5, 2022

(65) Prior Publication Data
US 2022/0342245 A1 Oct. 27, 2022

(51) Int. Cl.
*G02F 1/1345* (2006.01)
(52) U.S. Cl.
CPC .................. *G02F 1/1345* (2013.01)

(58) Field of Classification Search
CPC .............. G02F 1/1345; G02F 1/13458; G02F 1/133345
See application file for complete search history.

(56) References Cited

U.S. PATENT DOCUMENTS

| 4,721,365 A * | 1/1988 | Nishimura .......... G02F 1/13452 340/870.37 |
| 2002/0005928 A1* | 1/2002 | Hanakawa ............ G02F 1/1345 349/149 |

(Continued)

FOREIGN PATENT DOCUMENTS

| CN | 1614492 A | 5/2005 |
| CN | 107658234 A | 2/2018 |

(Continued)

*Primary Examiner* — Nathanael R Briggs
(74) *Attorney, Agent, or Firm* — HOUTTEMAN LAW LLC

(57) ABSTRACT

The embodiment of the present disclosure provides a driving backplate including a base substrate, and an insulation layer and a plurality of conductive structures on the base substrate. The insulation layer insulates the plurality of conductive structures from each other. The plurality of conductive structures includes a first conductive layer and a second conductive layer sequentially stacked along a direction away from the base substrate. At least one portion of a region in which the first conductive layer is in contact with the second conductive layer includes a flat contact region. An opening is formed at a position in the insulation layer corresponding to the conductive structure. An edge of the opening in the insulation layer is between the first conductive layer and the second conductive layer and is correspondingly in edge regions of the first conductive layer and the second conductive layer.

13 Claims, 5 Drawing Sheets

(56) References Cited

U.S. PATENT DOCUMENTS

| | | | |
|---|---|---|---|
| 2005/0092990 A1* | 5/2005 | Yoo | H01L 29/66765 |
| | | | 257/E21.414 |
| 2012/0113346 A1 | 5/2012 | Choi | |
| 2020/0203390 A1* | 6/2020 | Kim | H01L 27/1244 |

FOREIGN PATENT DOCUMENTS

| | | |
|---|---|---|
| CN | 108630710 A | 10/2018 |
| CN | 109407436 A | 3/2019 |
| CN | 109597245 A | 4/2019 |
| CN | 110190087 A | 8/2019 |
| CN | 110471219 A | 11/2019 |

* cited by examiner

DRIVING BACKPLATE, A MANUFACTURING METHOD THEREOF AND A DISPLAY MODULE

TECHNICAL FIELD

Embodiments of the present disclosure relates to the field of display technologies, and in particular, to a driving backplate, a manufacturing method thereof and a display module.

BACKGROUND

For large-sized Liquid Crystal Displays (LCDs), a light-emitting efficiency of the lateral light source scheme is difficult to meet the display requirement, therefore the large-sized LCDs generally employ a direct type light source scheme.

Since mini light-emitting diodes (Mini LEDs) have advantages such as lightness, thinness and a high contrast, the usage of the Mini LEDs as the backlight source has become the mainstream scheme for the direct type light source.

SUMMARY

Embodiments of the present disclosure provide a driving backplate, a method for manufacturing the same, and a display module.

For a first aspect, an embodiment of the present disclosure provides a driving backplate including a base substrate, and an insulation layer and a plurality of conductive structures on the base substrate, the insulation layer insulating the plurality of conductive structures from each other.

Each of the plurality of conductive structures includes a first conductive layer and a second conductive layer stacked sequentially along a direction away from the base substrate, and at least one portion of a region in which the first conductive layer is in contact with the second conductive layer includes a flat contact region.

An opening is formed at a position of the insulation layer corresponding to the conductive structure. An edge of the opening in the insulation layer is between the first conductive layer and the second conductive layer and is correspondingly in edge regions of the first conductive layer and the second conductive layer.

An orthographic projection of the opening on the base substrate overlaps an orthographic projection, on the base substrate, of the flat contact region where the first conductive layer is in contact with the second conductive layer.

In some embodiments, the edge of the opening in the insulation layer is attached to the horizontal contact surface at which the first conductive layer is in contact with the second conductive layer and forms a slope angle in a range from 25° to 70° with respect to the horizontal contact surface to which the edge of the opening in the insulation layer is attached.

An edge of the second conductive layer is attached to a slope surface of the edge of the opening.

In some embodiments, the insulation layer and the plurality of conductive structures are on a same side of the base substrate, and a difference between a thickness, along a direction away from the base substrate, of the insulation layer and a thickness, along a direction away from the base substrate, of plurality of conductive structures is in a range from 0 μm to 0.5 μm.

In some embodiments, the conductive structure further includes a protective layer on a side of the second conductive layer away from the base substrate, and the protective layer encapsulates the second conductive layer.

In some embodiments, the first conductive layer includes a first sub-layer and a second sub-layer stacked in sequence along a direction away from the base substrate, and the second sub-layer encapsulates the first sub-layer.

In some embodiments, each of an orthographic projection, on the base substrate, of an edge of the first sub-layer, an orthographic projection, on the base substrate, of an edge of the second conductive layer, an orthographic projection, on the base substrate, of an edge of the second sub-layer, and an orthographic projection, on the base substrate, of an edge of the protective layer is at a periphery of an orthographic projection, on the base substrate, of the opening. The edge of the first sub-layer, the edge of the second conductive layer, the edge of the second sub-layer, and the edge of the protective layer are sequentially arranged along a direction from an inside of the orthographic projection of the opening to an outside of the orthographic projection of the opening.

In some embodiments, the driving backplate includes a non-display region with the plurality of the conductive structures located therein.

The plurality of conductive structures are arranged at equal intervals along a straight line direction.

In some embodiments, a width direction of the plurality of conductive structures is parallel to the straight line direction along which the plurality of conductive structures are arranged.

Along the width direction of the plurality of conductive structures, a size of the flat contact region in which the first conductive layer is in contact with the second conductive layer is in a range from 50 μm to 100 μm.

In some embodiments, the insulation layer includes a first film layer and a second film layer stacked sequentially away from the base substrate.

The first film layer includes an inorganic insulation material, and the second film layer includes an organic resin material.

In some embodiments, the driving backplate further includes dummy bonding terminals, and the dummy bonding terminals are in the non-display region and at at least one side of the plurality of conductive structures arranged along the straight line direction.

The dummy bonding terminals includes a first bonding terminal and a second bonding terminal arranged sequentially along the straight line direction along which the plurality of conductive structures are arranged.

The first bonding terminal includes a first opening in the second film layer and the first film layer exposed in the first opening. The second bonding terminal has the same structure as the conductive structure and is floated.

The first bonding terminal, the second bonding terminal, and the conductive structure are spaced apart from one another.

As a second aspect, a display module including above driving backplate is provided.

As a third aspect, a method for manufacturing a driving backplate is provided. The method includes: forming an insulation layer and a plurality of conductive structures on a base substrate; wherein the insulation layer insulates the plurality of conductive structures from each other; forming the plurality of conductive structures includes sequentially forming a first conductive layer and a second conductive layer, such that the first conductive layer and the second conductive layer are stacked along a direction away from the base substrate, and at least one portion of a region in which the first conductive layer is in contact with the second conductive layer includes a flat contact region; forming the insulation layer includes forming an opening at a position of the insulation layer corresponding to the conductive structure, such that an edge of the opening in the insulation layer is located between the first conductive layer and the second conductive layer and is correspondingly in edge regions of the first conductive layer and the second conductive layer.

An orthographic projection of the opening on the base substrate overlaps an orthographic projection, on the base substrate, of the flat contact region in which the first conductive layer is in contact with the second conductive layer.

In some embodiments, the method includes: forming the first conductive layer of the plurality of conductive structures on the base substrate; forming the insulation layer on the base substrate; forming the opening at the position of the insulation layer corresponding to the first conductive layer, such that the edge of the opening is attached to a horizontal contact surface wherein the first conductive layer is in contact with the second conductive layer; and forming the second conductive layer of the plurality of conductive structures on the base substrate.

The method further includes: forming a protective layer for the plurality of conductive structures on the base substrate, such that the protective layer encapsulates the second conductive layer.

BRIEF DESCRIPTION OF THE DRAWINGS

The accompanying drawings, which facilitate a further understanding of the present disclosure and constitute a part of the specification, are used in conjunction with the following specific embodiments to explain the present disclosure, but are not intended to limit the present disclosure. The above and other features and advantages will become more apparent to one of ordinary skill in the art by describing detailed exemplary embodiments thereof with reference to the drawings, in which.

Figure 1:
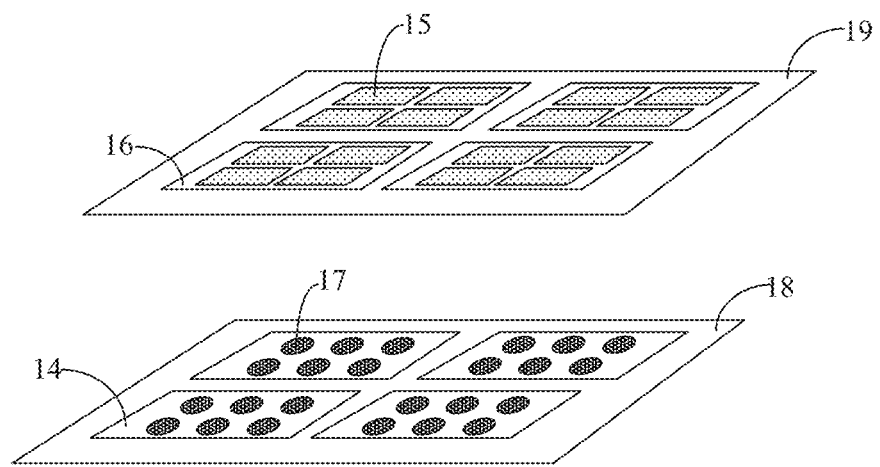
FIG. 1 is a schematic diagram showing a lamp region on a backlight substrate and a display unit on a display substrate disposed correspondingly to each other.

REFERENCE SIGN LIST 1. a base substrate; 2. an insulation layer; 20. an opening; 21. a first film layer; 22. a second film layer; 220. a first opening; 3. a conductive structure; 31. a first conductive layer; 311. a first sub-layer; 312. a second sub-layer; 32. a second conductive layer; 33. a protective layer; 101. a flat contact region; 102. a non-flat contact region; 103. a bonding region; 104. a non-bonding region; 4. a dummy bonding terminal; 41. a first bonding terminal; 42. a second bonding terminal; 5. a first electrode; 6. a second electrode; 7. a third electrode; 8. a first connection line; 9. a second connection line; 10. a third connection line; 11. a bonding electrode; 12. a driving backplate; 13. a liquid crystal cell; 131. an array substrate; 132. a color filter substrate; 14. a lamp region; 15. a pixel; 16. a display unit; 17. a lamp bead; 18. a backlight substrate; and 19. a display substrate.

DETAILED DESCRIPTION

In order to enable one of ordinary skill in the art to better understand the technical solution of the embodiments of the present disclosure, a driving backplate and a method for manufacturing the same, and a display module provided by the embodiments of the present disclosure are further described in detail in combination with the drawings and specific embodiments.

The embodiments of the present disclosure will be more fully described below with reference to the accompanying drawings, but the embodiments shown may be embodied in different forms and should not be interpreted as being limited to the embodiments set forth in the present disclosure. On the contrary, these embodiments are provided for the purpose of making the present disclosure thorough and complete, and will enable one of ordinary skill in the art to fully understand the scope of the present disclosure.

The embodiments of the present disclosure are not limited to the embodiments shown in the drawings, but include modifications of the configurations formed based on the manufacture process. Therefore, the regions illustrated in the drawings have schematic properties, and the shapes of the regions illustrated in the drawings show the specific shapes of the regions, but are not intended to be restrictive.

In a display solution of a large-sized Liquid Crystal Displays (LCDs), a light-emitting efficiency of an edge-lit light source scheme is difficult to meet the display requirement, therefore the large-sized LCDs generally employ a direct type light source scheme. A backlight scheme for the mini light emitting diodes (Mini LEDs) has advantages such as lightness, thinness, and a high contrast, the usage of the Mini LEDs as the backlight source has become the mainstream scheme for the direct type scheme.

Figure 2:
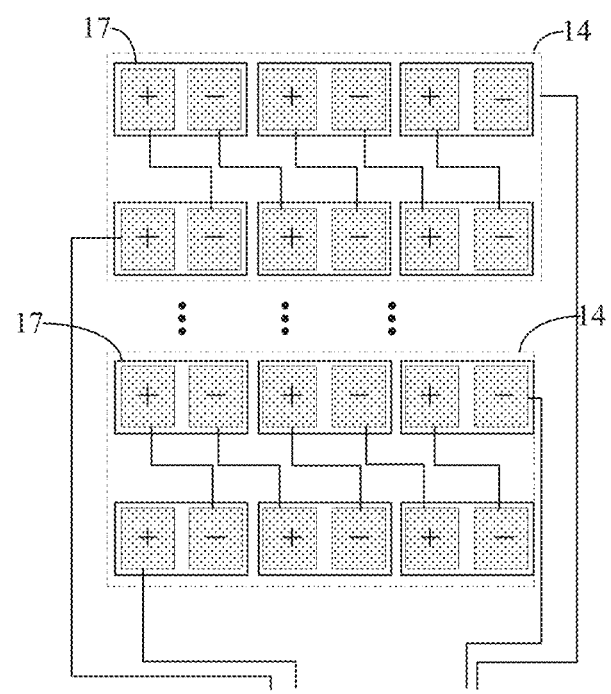
FIG. 2 is a schematic diagram showing lamp beads connected in series in lamp regions.
Figure 3:
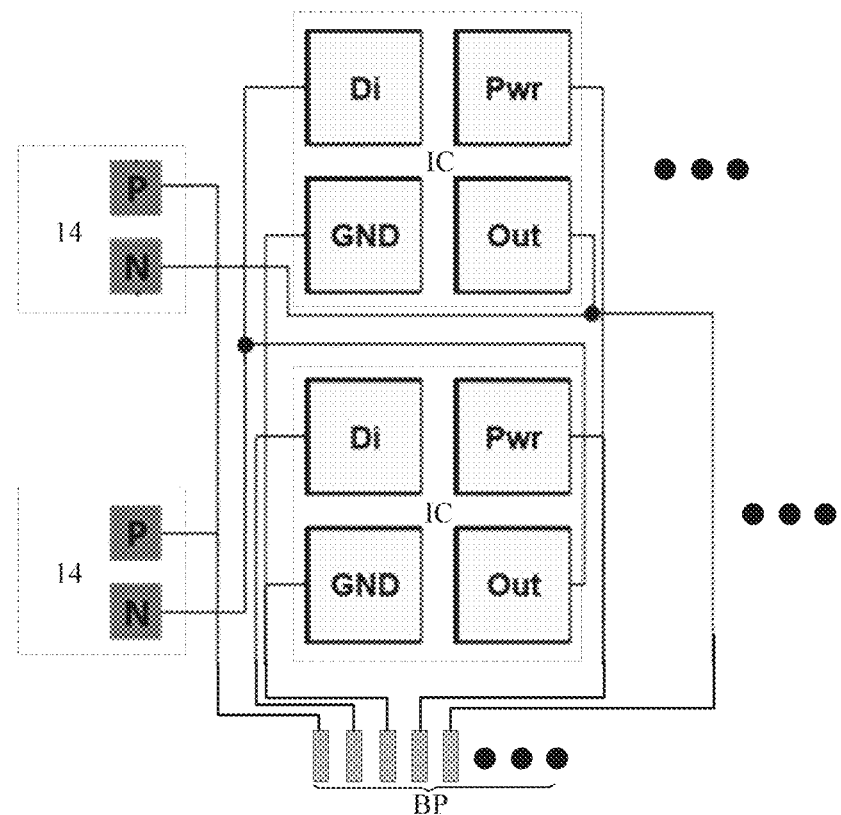
FIG. 3 is a schematic diagram showing a connection between positive and negative electrodes of lamp beads connected in series in a lamp region and corresponding signal electrodes on a driver chip of a display unit, and a connection between the positive and negative electrodes of the lamp beads connected in series in the lamp region and bonding electrodes on a backlight substrate.

As shown in FIG. 1 and FIG. 2, when the Mini LEDs are used as the backlight source, beads of the Mini LEDs are fixed in lamp regions 14 of a backlight substrate 18, the lamp regions 14 are in one-to-one correspondence with display units 16 each of which is composed of a fixed number of pixels 15 on a display substrate 19. Four to twelve groups of three-color lamp beads 17 (i.e., red, green and blue lamp beads), or four to twelve one-color lamp beads 17 (i.e., white lamp beads) are uniformly distributed in each of the lamp regions 14 (e.g., each lamp region has length and width dimensions in ranges from about 10 to 20 mm), and then four to twelve groups of lamp beads or four to twelve lamp beads in each lamp region 14 are connected in series. Positive and negative electrodes (i.e., P is the positive electrode of the bead, and N is the negative electrode of the bead) of each of the lamp beads 17 connected in series in each lamp region 14 are electrically connected to the bonding terminal in the bonding region of the backlight substrate 18 and the corresponding signal electrode of the driver chip of the display unit 16 corresponding to the lamp region 14, respectively; and then, the same signal electrodes of the driver chips for a column of display units 16 are electrically connected to a corresponding bonding terminal in the bonding region. Taking the white lamp bead as an example, a schematic circuit diagram is shown in FIG. 3, where P is a lead-out positive electrode of the lamp beads connected in series in one lamp region, and N is a lead-out negative electrode of the lamp beads connected in series in one lamp region. Di and Out are addressing signal electrodes of a driver chip IC for the display unit; GND is a ground signal electrode of the driver chip IC for the display unit; and Pwr is a power input signal electrode of the driver chip IC for the display unit.

If one-color lamp beads (such as the white lamp beads) are disposed in the lamp region corresponding to one display unit, the number of the one-color lamp beads is not necessarily limited. If the red, green and blue lamp beads are disposed in the lamp region corresponding to one display unit, the numbers of the red, green and blue lamp beads in the lamp region corresponding to each display unit are equal to each other, and one red lamp bead, one blue lamp bead and one green lamp bead may form one group of lamp beads. In addition, it should be noted that the white lamp beads are the Mini LEDs emitting blue light, the Mini LEDs emitting blue light are arranged in an array on the backlight substrate, and then, red and green quantum dot color filters are formed on the array of the Mini LEDs emitting blue light, so that a white light backlight source can be realized.

Referring to FIG. 3, the bonding terminals BP arranged regularly are formed in the bonding region of the backlight substrate, and each of the bonding terminals BP is electrically connected to a corresponding electrode (i.e., in the non-bonding region) of the backlight substrate. In addition, the bonding terminal BP is bound with and connected to a flexible circuit board at a periphery of the backlight substrate through a conductive adhesive (ACF), and the flexible circuit board is bound with and connected to a printed circuit board outside the backlight substrate, so that the printed circuit board can provide an input signal to control the electrodes of the backlight substrate, and in turn to control the turn-on or turn-off of the lamp beads in the lamp regions on the backlight substrate.

Figure 4:
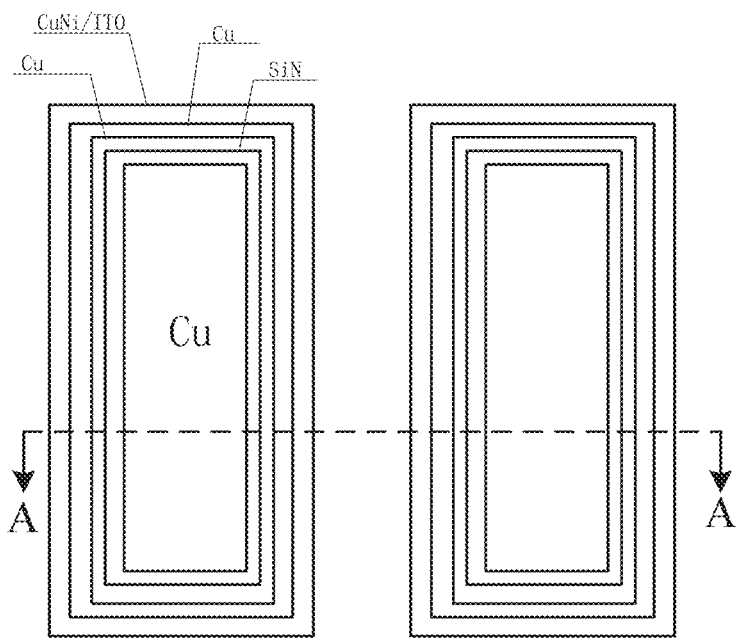
FIG. 4 is a schematic top view showing a structure of a bonding electrode according to the present disclosure.
Figure 5:
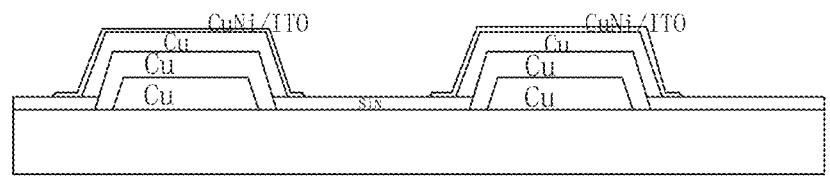
FIG. 5 is a schematic cross-sectional view showing the structure of FIG. 4 taken along a line AA.

As shown in FIG. 4 and FIG. 5, each of the bonding terminals is generally formed by stacking a plurality of metal (e.g., Cu) layers, i.e., from a Cu layer away from the base substrate to a Cu layer proximal to the base substrate, with a Cu layer proximal to the outer side encapsulating a Cu layer adjacent to the Cu layer and proximal to the inner side successively. An inorganic insulation layer SiN is formed between the adjacent bonding terminals, and the inorganic insulation layer SiN has a thickness smaller than a thickness of each of the Cu layers. Referring to FIG. 4, along a direction from the inside to the outside of the bound terminal, the edges of the Cu layers extend outward in turn. The above-described bonding terminal has the following three problems during the manufacture process.

Firstly, the plurality of Cu layers forming the bonding terminal has is a total thickness in a range from about 2 μm to 6 μm, and the inorganic insulation layer SiN has a thickness about 0.1 μm, which results in a relatively large step from the bonding terminal to the exposed upper surface of the inorganic insulation layer SiN, in turn easily results that conductive particles in conductive adhesive for connecting the flexible circuit board and the bonding terminal are accumulated at the step, such that a bonding contact between the flexible circuit board and the bonding terminal is poor.

Secondly, an effective width of the bonding terminal is a width of the outermost Cu layer away from the base substrate (the bonding terminal has a rectangular (strip) shape, the effective width is a size perpendicular to a length direction of the bonding terminal). However, the innermost Cu layer proximal to the base substrate has a more stable width due to the good internal contact of the bonding terminal. Considering the alignment between two adjacent layers (i.e., the upper and lower layers) inside the bonding terminal and the manufacture deviation of the dimension, the innermost Cu layer has a width in a range from about 20 μm to 60 μm, which is far less than the width of the outermost Cu layer. Taking the outermost Cu layer having the width of 70 μm as an example, and considering the manufacture deviation (i.e., the alignment deviation between the upper and lower layers is in a range from 3 μm to 5 μm, and the dimension deviation is ±2 μm) of the two adjacent conductive layers (i.e., the upper and lower layers) of the bonding terminal, in order to ensure that the upper layer completely encapsulates the lower layer, the innermost Cu layer has only a width of 40 μm. That is, a region where the film thickness is stable in the binding terminal has only a width of 40 μm. Therefore, the flat contact region, in which a contact is really stable in the bonding terminal, is not wide enough, and thus, the contact surface at which the inner and outer conductive layers of the bonding terminal are in contact with each other is not flat enough, thereby influencing the bonding connection yield of the bonding terminal.

Thirdly, the CuNi/ITO layer on a surface of the outermost Cu layer of the bonding terminal is used as a protective layer to protect the lower Cu layers from being oxidized and corroded during a high-temperature manufacture process. The CuNi/ITO layer is thin and has a thickness about 0.1 μ,m, and the Cu layers below the protective layer are thick. Therefore, an edge of the CuNi/ITO layer encapsulating the lower Cu layers has a large thickness and in turn is prone to be broken, so that the lower Cu layers cannot be fully protected.

In order to solve the technical problem of the bonding terminal during the manufacture process, the embodiments of the present disclosure provide a driving backplate, a manufacturing method thereof and a display module.

Figure 6:
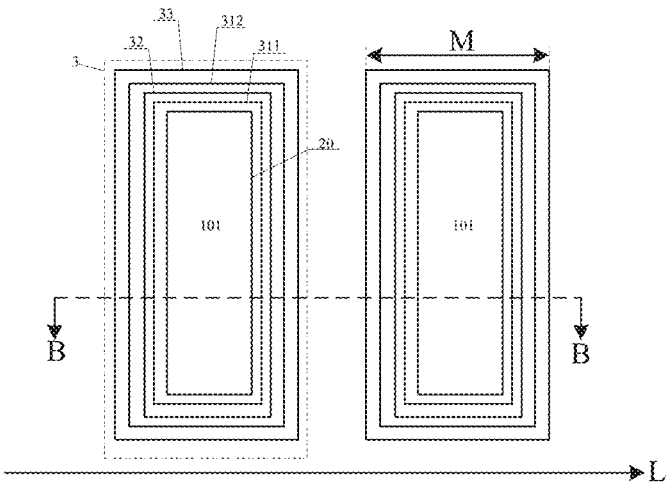
FIG. 6 is a schematic top view showing a structure of a conductive structure according to an embodiment of the present disclosure.
Figure 7:
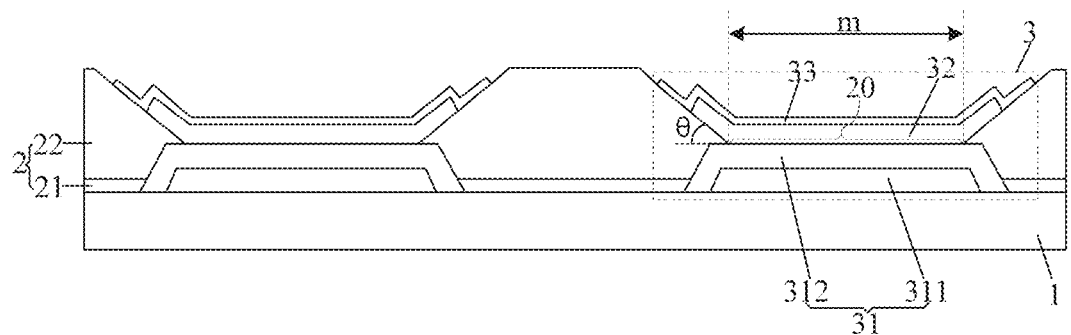
FIG. 7 is a schematic cross-sectional view showing the structure of FIG. 6 taken along a line BB.

An embodiment of the present disclosure provides a driving backplate. As shown in FIGS. 6 and 7, the driving backplate includes a base substrate (i.e., base plate) 1, an insulation layer 2 and a plurality of conductive structures 3 disposed on the base substrate 1. The insulation layer 2 insulates the plurality of conductive structures 3 from each other. A conductive structure 3 includes a first conductive layer 31 and a second conductive layer 32. The first conductive layer 31 and the second conductive layer 32 are sequentially stacked along a direction away from the base substrate 1. At least a portion of a region in which the first conductive layer 31 is in contact with the second conductive layer 32 is a flat contact region. An opening 20 is formed at a position of the insulation layer 2 corresponding to the conductive structure 3. An edge of the opening 20 in the insulation layer 2 is located between the first conductive layer 31 and the second conductive layer 32 and is located correspondingly at edge regions of the first conductive layer 31 and the second conductive layer 32. An orthographic projection of the opening 20 on the base substrate 1 overlaps an orthographic projection, on the base substrate 1, of the flat contact region in which the first conductive layer 31 is in contact with the second conductive layer 32.

The edge of the opening 20 in the insulation layer 2 is located between the first conductive layer 31 and the second conductive layer 32 and located correspondingly at the edge regions of the first conductive layer 31 and the second conductive layer 32. With such an arrangement, the opening 20 in the insulation layer 2 defines the position of the second conductive layer 32, and a pattern of the second conductive layer 32 is formed just in the opening 20, so that the alignment difficulty between the second conductive layer 32 and the first conductive layer 31 and the manufacture difficulty during the manufacture process can be reduced.

Figure 8:
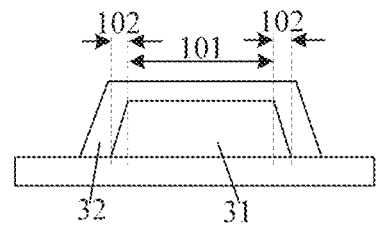
FIG. 8 is a schematic diagram showing a flat contact region and a non-flat contact region where a first conductive layer contacts a second conductive layer according to the present disclosure.

In the present disclosure, as shown in FIG. 8, the region in which the first conductive layer 31 is in contact with the second conductive layer 32 in the conductive structure 3 includes a flat contact region 101 located in the middle region of the conductive structure 3 and a non-flat contact region 102 located at the edge region of the conductive structure 3. The flat contact region 101 has a horizontal contact surface on which flat surface regions in the middles of the two conductive layers are in contact with each other, and the non-flat contact region 102 has a non-horizontal contact surface on which non-flat surface regions at the edges of the two conductive layers are in contact with each other.

In some embodiments, the insulation layer 2 and the plurality of conductive structures 3 are located on the same side of the base substrate 1, and a difference between a thickness, along a direction away from the base substrate 1, of the insulation layer 2 and a thickness, along a direction away from the base substrate 1, of the conductive structures 3 is in a range of 0 μm to 0.5 μm. That is, the insulation layer 2 and the conductive structure 3 are substantially the same in thickness. In some embodiments, the conductive structure 3 may have a thickness in a range of 2 μm to 6 μm. In some embodiments, the insulation layer 2 may have a thickness equal to the thickness of the conductive structure 3. Alternatively, the insulation layer 2 may have a thickness slightly greater than the thickness of the conductive structure 3. Alternatively, the insulation layer 2 may have a thickness slightly smaller than the thickness of the conductive structure 3.

Figure 9:
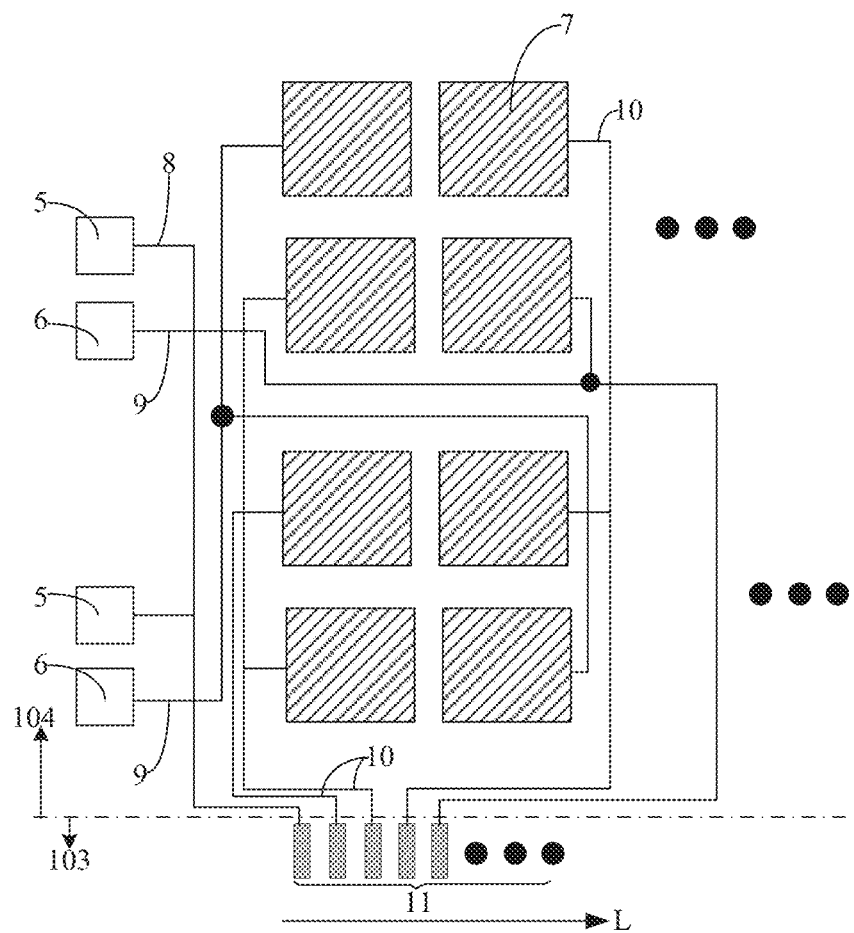
FIG. 9 is a schematic diagram showing an arrangement of conductive structures on a driving backplate according to an embodiment of the present disclosure.

In some embodiments, the driving backplate includes a non-display region, and the plurality of conductive structures are disposed in the non-display region. The plurality of conductive structures are arranged at equal intervals along a straight line direction. As shown in FIG. 9, the driving backplate includes a bonding region 103 in the non-display region, and the driving backplate further includes bonding electrodes 11 in the bonding region 103. The conductive structure includes the bonding electrodes 11. The driving backplate includes a plurality of bonding electrodes 11 arranged at equal intervals along the straight line direction L.

Compared with the structure of the bonding terminal in FIG. 5, in the structure of the bonding electrode 11 in the embodiment, on one hand, a thickness of the insulation layer 2 is substantially the same as that of the bonding electrode 11, so that the insulation layer 2 can fill up the step between the bonding electrode 11 and the base substrate 1, thereby preventing the conductive particles in a conductive adhesive from being accumulated at the step between the bonding electrode 11 and the base substrate 1 when the bonding connection between the bonding electrode 11 and the flexible circuit board is realized by the conductive adhesive, and further ensuring good contact between the bonding electrode 11 and the flexible circuit board; on the other hand, the insulation layer 2 covers the non-flat edges of the first conductive layer 31 and protects the non-flat edges of the first conductive layer 31, so that the second conductive layer 32 is not required to encapsulate the first conductive layer 31, and the width of the first conductive layer 31 is not required to be small than the width of the second conductive layer 32, therefore the second conductive layer 32 and the first conductive layer 31 can be designed as having the same width. Compared with the structure of the bonding terminal in FIG. 5, the width of the flat contact region 101 in which the first conductive layer 31 is in contact with the second conductive layer 32 can be increased, thereby increasing an area of a region in which the first conductive layer 31 is in effective and stable contact with the second conductive layer 32, and improving the contact yield of the first conductive layer 31 and the second conductive layer 32 and the bonding connection yield of the bonding electrode 11 and the flexible circuit board; on the other hand, for the structural configuration of the bonding electrode 11 in the embodiment, since the second conductive layer 32 is formed in the opening 20 of the insulation layer 2, the alignment complexity of the second conductive layer 32 and the first conductive layer 31 during the manufacture process of the bonding electrode 11 can be simplified, the manufacturing deviation (including the alignment deviation and the dimension deviation of the two conductive layers) between the second conductive layer 32 and the first conductive layer 31 can be reduced, and thus the manufacturing difficulty of the bonding electrode 11 can be reduced.

In some embodiments, the edge of the opening 20 in the insulation layer 2 is attached to a horizontal contact surface of the first conductive layer 31 is in contact with the second conductive layer 32, and the edge of the opening 20 forms a slope angle θ of 25° to 70° with respect to the horizontal contact surface to which the edge of the opening 20 in the insulation layer 2 is attached. The edge of the second conductive layer 32 is attached to a slope surface of the edge of the opening 20. The insulation layer 2 may include an organic insulation material, and the edge of the opening 20 in the insulation layer 2 may form a slope angle θ of 25° to 70° through conventional exposure and development processes. The edge of the second conductive layer 32 is attached to the slope surface of the edge of the opening 20, such that the bonding electrodes substantially has a transverse "X" shape when viewed in cross-section in FIG. 7. With such an arrangement, the second conductive layer 32 is not required to encapsulate the first conductive layer 31, so that the width of the flat contact region 101 in which the first conductive layer 31 is in contact with the second conductive layer 32 can be increased, the area of the effective and stable contact region between the first conductive layer 31 and the second conductive layer 32 can be increased, and in turn, the bonding connection yield of the bonding electrode 11 and the flexible circuit board can be improved.

In some embodiments, the conductive structure 3 further includes a protective layer 33 on a side of the second conductive layer 32 away from the base substrate 1, and the protective layer 33 may encapsulate the second conductive layer 32. In some embodiments, the protective layer 33 includes CuNi or ITO. In some embodiments, the first conductive layer 31 and the second conductive layer 32 are made of copper, but the first conductive layer 31 and the second conductive layer 32 may also be made of other conductive metals, such as aluminum, silver, etc. Copper is tended to be oxidized and corroded during the high-temperature manufacture process, as a result, the conductivity of the copper may be influenced. Since the protective layer 33 is formed on the second conductive layer 32, the second conductive layer 32 can be protected from being oxidized and corroded during the high-temperature manufacture process.

In some embodiments, edges of the protective layer 33 are attached to the slope surface of the edge of the opening 20 in the insulation layer 2. In some embodiments, the protective layer 33 is thin and has a thickness about 0.1 μm. Since the protective layer 33 encapsulates only the edges of the second conductive layer 32 also attached to the slope surface of the edge of the opening 20 in the insulation layer 2, the thickness of the encapsulated film layers is significantly decreased as compared with the structure of the bonding terminal in FIG. 5, therefore the protective layer 33 is not easily broken, and thus the second conductive layer 32 can be well encapsulated and fully protected.

In some embodiments, the first conductive layer 31 includes a first sub-layer 311 and a second sub-layer 312. The first sub-layer 311 and the second sub-layer 312 are sequentially stacked along a direction away from the base substrate 1, and the second sub-layer 312 may encapsulate the first sub-layer 311. During the manufacture process of the first conductive layer 31, a metal thin film is formed on the base substrate 1 through an ion sputtering process. Since the energy in the ion sputtering process is high, the base substrate 1 cannot bear excessive energy to crack easily in a case where the formed metal thin film is too thick, therefore the first conductive layer 31 is formed to include at least two sub-layers. By forming at least two sub-layers during the manufacture process, the thickness of the metal thin film formed each time through the ion sputtering process can be decreased, and the base substrate 1 can be avoided from cracking due to the excessive energy in the ion sputtering process. In specific implementation, the thickness of the first conductive layer 31 is within a range from 1 μm to 3 μm, the thickness of each of the first sub-layer 311 and the second sub-layer 312 may be less than 1 μm to 2 μm, and the first conductive layer 31 generally may include two or three sub-layers.

In specific implementation, in the process of patterning a sub-layer of the first conductive layer 31, a photoresist layer is coated on a surface of the sub-layer; the exposure and development processes are performed on the photoresist layer, such that the sub-layer to be etched is exposed in the photoresist layer; and then the sub-layer is etched, and the edge of the sub-layer is not etched very cleanly during the etching process, therefore the edge of the sub-layer to be formed later needs to encapsulate the edge of the sub-layer formed earlier, so that the finally formed first conductive layer 31 has a good edge, and the problem that the poor edge of the first conductive layer 31 is corroded in a high-temperature environment during the subsequent process can be avoided.

In some embodiments, as shown in FIG. 6, all of an orthographic projection, on the base substrate 1, of the edge of the first sub-layer 311, an orthographic projection, on the base substrate 1, of the edge of the second conductive layer 32, an orthographic projection, on the base substrate 1, of the edge of the second sub-layer 312, and an orthographic projection, on the base substrate 1, of the edge of the protective layer 33 are at a periphery of an orthographic projection of the opening 20 on the base substrate 1. The edge of the first sub-layer 311, the edge of the second conductive layer 32, the edge of the second sub-layer 312, and the edge of the protective layer 33 are sequentially arranged along a direction from the inside to the outside of the orthographic projection of the opening 20. With the arrangement, the width of the flat contact region where the second conductive layer 32 is in contact with the second sub-layer 312 and the width of the flat contact region where the second sub-layer 312 is in contact with the first sub-layer 311 can be obviously increased compared with the width of the flat contact region where the Cu2 layer is in contact with the Cu 1-2 layer and the width of the flat contact region where the Cu 1-2 layer is in contact with the Cu1-1 layer in FIG. 5, so that the area of the contact surface on which the upper conductive layer is in effective and stable contact with the lower conductive layer of the bonding electrode can be increased, the contact yield between the upper conductive layer and the lower conductive layer of the bonding electrode can be improved, meanwhile the contact surface between the upper conductive layer and the lower conductive layer of the bonding electrode tends to be flat, and the bonding connection yield of the bonding electrode and the flexible circuit board can be improved.

In some embodiments, referring to FIGS. 6 and 7, a width direction M of the conductive structure 3 is parallel to the straight line direction L along which the conductive structures 3 are arranged. Along the width direction M of the conductive structure 3, a size m of the flat contact region 101 of the first conductive layer 31 and the second conductive layer 32 is in a range from 50 μm to 100 μm. For example, in the embodiment, the width direction M of the bonding electrodes 11 is parallel to the straight line direction L along which the bonding electrodes 11 are arranged. Along the width direction M of the bonding electrode 11, the width m of the flat contact region 101 of the first conductive layer 31 and the second conductive layer 32 is in a range from 50 μm to 100 μm. Along the width direction M of bonding electrode 11, the size of the flat contact region of Cu2 layer and Cu1-2 layer of the bonding terminal in FIG. 5 is in a range from 20 μm to 60 μm. The above comparison shows that, in the structure of bonding electrode 11 in the embodiment, the width m of the flat contact region 101 of first conductive layer 31 and second conductive layer 32 is greatly increased, so that the area of the contact surface on which the upper conductive layer is in effective and stable contact with the lower conductive layer of the bonding electrode can be increased, the contact yield between the upper conductive layer and the lower conductive layer of the bonding electrode can be improved, meanwhile the contact surface between the upper conductive layer and the lower conductive layer of the bonding electrode tends to be flat, and the bonding connection yield of the bonding electrode and the flexible circuit board can be improved.

In some embodiments, as shown in FIG. 7, the insulation layer 2 includes a first film layer 21 and a second film layer 22 stacked sequentially away from the base substrate 1. The first film layer 21 includes an inorganic insulation material, and the second film layer 22 includes an organic resin material. For example, the first film 21 includes SiN or SiNO, and the second film layer 22 includes polyimide or photoresist. Both the first film layer 21 and the second film layer 22 include a transparent material. The first film layer 21 has the function of blocking water vapor and oxygen, thereby further improving the sealing property of the driving backplate.

Figure 10:
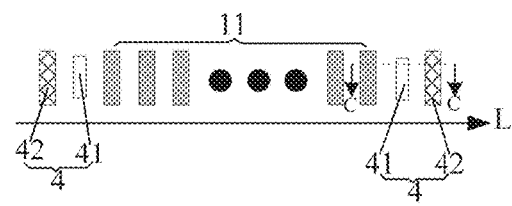
FIG. 10 is a schematic diagram showing an arrangement of bonding electrodes and dummy bonding terminals in a bonding region of a driving backplate according to an embodiment of the present disclosure.
Figure 11:
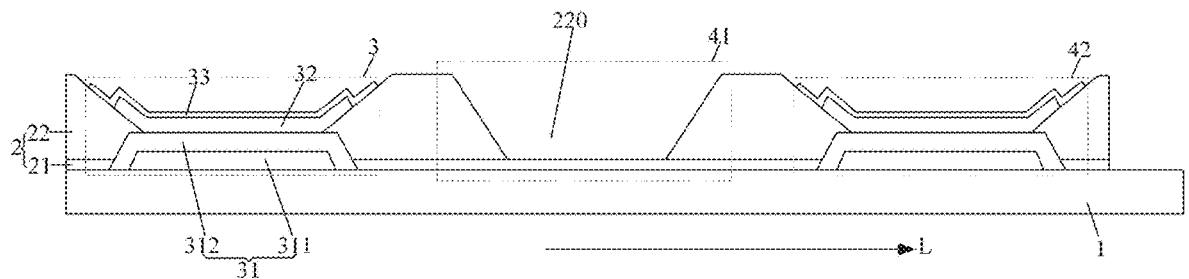
FIG. 11 is a schematic cross-sectional view showing the structure of FIG. 10 taken along a line CC.

In some embodiments, as shown in FIG. 10 and FIG. 11, the driving backplate further includes dummy bonding terminals 4 in the non-display region, and the dummy bonding terminals 4 are disposed in at least one side of the conductive structures arranged along the straight line direction L. The dummy bonding terminals 4 include first bonding terminals 41 and second bonding terminals 42 sequentially arranged along the straight line direction L along which the conductive structures are arranged. The first bonding terminal 41 includes a first opening 220 formed in the second film layer 22 and the first film layer 21 exposed in the first opening 220. The second bonding terminal 42 has the same structure as the conductive structure, and the second bonding terminal 42 is floated. The first bonding terminal 41, the second bonding terminal 42, and the conductive structure are spaced apart from each other. In the embodiment, for example, the dummy bonding terminals 4 are formed in the bonding region, and the dummy bonding terminals 4 are formed in at least one side of the bonding electrodes 11 arranged along the straight line direction L. The dummy bonding terminals 4 include first bonding terminals 41 and second bonding terminals 42 sequentially arranged along the straight line direction L along which the bonding electrodes 11 are arranged. As shown in FIG. 11, the first bonding terminal 41 includes a first opening 220 formed in the second film 22 and the first film 21 exposed in the first opening 220. The second bonding terminal 42 has the same structure as the bonding electrode 11, and the second bonding terminal 42 is floated. The first bonding terminal 41, the second bonding terminal 42 and the bonding electrode 11 are spaced apart from each other. Any adjacent two of the first bonding terminal 41, the second bonding terminal 42 and the bonding electrode 11 are equally spaced apart from each other. When the bonding electrode 11 is bound and connected to the flexible circuit board through the conductive adhesive, the first bonding terminal 41 is adhered to the flexible circuit board through the conductive adhesive, at this time, the conductive adhesive is pressed to the first film layer 21 exposed in the first opening 220. Since the first film layer 21 is transparent and the base substrate 1 is also made of a transparent material, the distribution and accumulation of the conductive particles in the conductive adhesive can be observed more clearly through the first film layer 21 from the side of the base substrate 1. Therefore, when the bonding effect between the bonding electrode 11 and the flexible circuit board is detected, the distribution and accumulation of the conductive particles in the conductive adhesive can be observed without destructively tearing off the flexible circuit board. In addition, when the bonding electrode 11 is bound and connected to the flexible circuit board through the conductive adhesive, the second bonding terminal 42 is adhered to the non-conductive structure on the flexible circuit board. Since the bonding electrodes 11 are bound and connected to the flexible circuit board through a whole piece of conductive adhesive along the straight line direction L along which the bonding electrodes 11 are arranged, both ends of the whole piece of conductive adhesive are prone to be peeled off during the flexibly folding process of the bonded flexible circuit board, so that the bonding electrode 11 at the end sides are disconnected from the corresponding electrode on the flexible circuit board, thereby affecting the bonding connection yield. With the second bonding terminals 42, even if the both ends of the whole piece of the conductive adhesive are peeled off, the second bonding terminal 42 without any electric connection may be disconnected from the flexible circuit board, so that the peeling off of both ends of the conductive adhesive cannot affect the bonding electrodes 11 with the electric connection, and the bonding connection yield between the bonding electrode 11 and the flexible circuit board can be ensured.

In some embodiments, the insulation layer may only include an organic resin material. That is, only one insulation layer is formed, in this case, the first bonding terminal of the dummy bonding terminals include an opening formed in the insulation layer and the base substrate exposed in the opening. The distribution and accumulation of the conductive particles in the conductive adhesive can be observed clearly from the base substrate side through the base substrate, so that the distribution and accumulation of the conductive particles in the conductive adhesive can be observed without destructively tearing off the flexible circuit board when the bonding effect between the bonding electrode and the flexible circuit board is detected.

In some embodiments, as shown in FIG. 9, the driving backplate further includes a non-bonding region 104. The non-bonding region 104 is a substrate region of the driving backplate except for the bonded region 103, and the substrate region is configured to form, therein, electrodes connected to a light source (e.g., a light emitting diode), electrodes connected to a light source driving circuit, and connection lines connected to the electrodes. The driving backplate further includes a first electrode 5 and a second electrode 6 in the non-bonding region 104, and the first electrode 5 and the second electrode 6 are respectively electrically connected to a positive electrode and a negative electrode of the light source. The conductive structure further includes a first electrode 5 and a second electrode 6. The light source is Mini LED lamp bead. Of course, the light source may also be an LED lamp bead or a Micro LED lamp bead. The first electrode 5 and second electrode 6 adopt above-mentioned structure of the conductive structure, thereby increasing a width of a flat contact region in which the first electrode 5 and second electrode 6 are respectively in contact with the positive electrode and the negative electrode of the light source, increasing an area of the contact portion on which the first electrode 5 and second electrode 6 are respectively in effective and stable contact with the positive electrode and the negative electrode of the light source, and improving the contact yield between the first electrode 5 and second electrode 6 and the positive electrode and the negative electrode of the light source.

In some embodiments, the driving backplate further includes a plurality of third electrodes 7 in the non-bonding region 104, and the third electrodes 7 are electrically connected to corresponding signal terminals of the light source driving circuit. The conductive structure further includes the third electrode 7. The light source driving circuit refers to a circuit, such as a driver chip, for lighting and driving the light sources on the driving backplate. The third electrode 7 adopts the structure of the above conductive structure, so that the width of a flat contact region formed by the contact between the third electrode 7 and the corresponding signal terminal of the light source driving circuit can be increased, the area of an effective and stable contact portion between the third electrode 7 and the corresponding signal terminal of the light source driving circuit can be increased, and the contact yield between the third electrode 7 and the corresponding signal terminal of the light source driving circuit can be further improved.

In some embodiments, the driving backplate further includes first, second and third connection lines 8, 9, 10. The first connection lines 8 connect the first electrodes 5 to corresponding bonding electrodes 11; the second connection lines 9 connect the second electrodes 6 to corresponding third electrodes 7; and the third connection lines 10 connect the third electrode 7 to corresponding bonding electrode 11. The conductive structure further includes at least one of the first connection line 8, the second connection line 9, and the third connection line 10. Since the at least one of the first connection line 8, the second connection line 9 and the third connection line 10 is formed to have the structure of the conductive structure, on one hand, the width of a flat contact region formed by the contact between the upper conductive layer and the lower conductive layer of the connection line can be increased, and thus an area of the effective and stable contact portion between the upper conductive layer and the lower conductive layer of the connection line can be increased, and the stable connection performance of the connection line adopting the conductive structure can be improved; on the other hand, since only the cross-sectional area of the lower conductive layer of the connection line having the conductive structure is increased compared with the traditional connection line, the resistance of the connection line can be decreased, the attenuation loss of signals on the connection line can be reduced, and the signal transmission performance of the connection line can be improved.

In some embodiments, the driving backplate further includes a light source and a light source driving circuit. The positive electrode and the negative electrode of the light source are respectively in contact with and connected to the corresponding first electrode 5 and the corresponding second electrode 6. The signal terminals of the light source driving circuit are respectively in contact with and connected to the corresponding third electrodes 7. The light source is Mini LED lamp bead. Of course, the light source may also be an LED lamp bead or a Micro LED lamp bead.

Based on the above structure of the driving backplate, an embodiment of the present disclosure further provides a method for manufacturing the driving backplate. The method includes: forming an insulation layer and a plurality of conductive structures on a base substrate, such that the insulation layer insulates the plurality of conductive structures from each other; forming the plurality of conductive structure includes sequentially forming a first conductive layer and a second conductive layer, such that the first conductive layer and the second conductive layer are stacked along a direction away from the base substrate, and at least one portion of a region in which the first conductive layer is in contact with the second conductive layer include or is a flat contact region; forming the insulation layer includes forming an opening at a position of the insulation layer corresponding to the conductive structure, such that an edge of the opening in the insulation layer is located between the first conductive layer and the second conductive layer and is located in edge regions of the first conductive layer and the second conductive layer. An orthographic projection of the opening on the base substrate overlaps an orthographic projection, on the base substrate, of the flat contact region in which the first conductive layer is in contact with the second conductive layer.

In some embodiments, the method for manufacturing the driving backplate specifically includes steps S1 to S6.

At step S1, the first conductive layer of the plurality of conductive structures is formed on the base substrate.

Step S1 specifically includes step 10 and step 11. At step S10, a first conductive metal film, such as a copper layer, is deposited on the base substrate through an ion sputtering process; and then a pattern of a first sub-layer of the first conductive layer is formed through a patterning process (including photoresist coating, exposing, developing, etching processes, etc.). A pattern of the first sub-layer of each conductive structure are formed after the patterning process, such that the area of the orthographic projection of the first sub-layer on the base substrate, is gradually decreased along a direction perpendicular to the base substrate and away from the base substrate. For example, the cross section of the first sub-layer perpendicular to the base substrate is in a shape of a regular trapezoid or a regular trapezoid with waists in an arc-line shape. That is, the side surfaces of the first sub-layer except the upper and lower surfaces are inclined surfaces or arc surfaces.

At step S11, a second conductive metal film layer, such as a copper layer, is deposited on the base substrate through an ion sputtering process, after step S10; and then a pattern of the second sub-layer of the first conductive layer is formed through a patterning process (including photoresist coating, exposing, developing, etching processes, etc.). The second sub-layer encapsulates the first sub-layer. The area of the orthographic projection, on the base substrate, of the first conductive layer of each conductive structure formed through above process is gradually decreased along a direction perpendicular to the base substrate and away from the base substrate, for example, the cross section of the first conductive layer perpendicular to the base substrate is in a shape of a regular trapezoid or a regular trapezoid with waists in an arc-line shape. That is, the side surfaces of the first conductive layer except the upper surface and the lower surface are inclined surfaces or arc surfaces.

In some embodiments, before step S1, the method may include: forming an inorganic insulation layer, such as a SiN layer, on the base substrate. The inorganic insulation layer may protect the base substrate from being broken under an action of a stress generated by the first conductive layer formed subsequently.

At step S2, an insulation layer is formed on the base substrate; an opening is formed at a position of the insulation layer corresponding to the first conductive layer. An edge of the opening is attached to the horizontal contact surface on which the first conductive layer is in contact with the second conductive layer.

Step S2 specifically includes step S20 and step S21. At step S20, a first insulation film layer is formed on the entire surface of the base substrate through chemical vapor deposition, the first insulation film layer including SiN or SiNO materials, and then an opening is formed in a position of the first insulation film layer corresponding to the first conductive layer through a dry etching process to form a pattern of the first film layer. A flat surface region of the first conductive layer parallel to the horizontal surface of the base substrate is exposed in the opening. In some embodiments, a thickness of the first film layer is less than a thickness of the first sub-layer.

In some embodiments, no opening is formed at a position of the first insulation film layer corresponding to the first bonding terminal of the dummy bonding terminal, and an opening is formed at a position of the first insulation film layer corresponding to the second bonding terminal of the dummy bonding terminal.

At step S21, a second insulation film layer is coated on the entire surface of the base substrate, after step S20, the second insulation film layer including an organic resin material such as polyimide or a photoresist material, and then a portion of the second insulation film layer corresponding to the opening in the first film layer is removed through the exposure and development processes to form a pattern of the second film layer, namely the opening is formed in the second film layer. An areas of the orthographic projection, on the base substrate, of the opening in the second film layer formed through above process is gradually increased along a direction perpendicular to the base substrate and away from the base substrate, for example, the cross section, perpendicular to the base substrate, of the opening in the second film layer is in a shape of an inverted trapezoid or an inverted trapezoid with waists in an arc-line shape, that is, the side surfaces of the opening in the second film layer except the upper and lower openings are inclined surfaces or arc surfaces.

In some embodiments, the thickness of the insulation layer formed by the first film layer and the second film layer ranges from 2.5 μm to 6.5 μm. In some embodiments, the thickness of the insulation layer formed by the first film layer and the second film layer ranges from 1.5 μm to 5.5 μm.

In some embodiments, openings are formed at positions of the second insulation film layer corresponding to the first bonding terminal and the second bonding terminal of the dummy bonding terminals.

At step S3, second conductive layers of the plurality of conductive structures are formed on the base substrate.

In the step, a conductive metal film layer, such as a copper layer, is deposited on the base substrate through an ion sputtering process after step S2; and then a pattern of the second conductive layer is formed through a patterning process (including photoresist coating, exposure, development, etching, etc.). The pattern of the second conductive layer is formed in the opening formed in the insulation layer corresponding to the position of the first conductive layer, and the second conductive layer is in contact with and electrically connected to the first conductive layer via the opening in the insulation layer. A middle region of the second conductive layer is in contact with the first conductive layer to form a flat contact region, an edge region of the second conductive layer climbs over the side wall of the opening in the insulation layer, so that an area of the orthographic projection, on the base substrate, of the second conductive layer is gradually increased along a direction perpendicular to the base substrate and away from the base substrate. For example, the cross section, perpendicular to the base substrate, of the second conductive layer is in a shape of an inverted trapezoid or an inverted trapezoid with waists in an arc-line shape. That is, the side surfaces of the second conductive layer except the upper and lower surfaces are inclined surfaces or arc surfaces, therefore the entire cross section, perpendicular to the base substrate, of the first conductive layer and the second conductive layer has a transverse X shape.

The method also includes step S4 of forming a protective layer for the plurality of conductive structures on the base substrate, the protective layer encapsulates the second conductive layer.

In the step, a conductive metal film layer, such as a CuNi or ITO layer is deposited on the base substrate through an ion sputtering process after step S3, and then a pattern of the protective layer is formed through a patterning process (including photoresist coating, exposure, development, etching, etc.). A middle region of the protective layer corresponds to and is stacked with the middle region of the second conductive layer, and the edge region of the protective layer climbs over the side wall of the opening in the insulation layer, and the edge region of the protective layer encapsulates an edge of the second conductive layer which climbs over the side wall of the opening in the insulation layer, so as to protect the second conductive layer.

In addition, in some embodiments, the method for manufacturing the driving backplate further includes step S5 of forming a second insulation layer in the non-bonding region of the driving backplate, and forming an opening at a position in the second insulation layer corresponding to the conductive structure. The second insulation layer may protect the conductive structure in the non-bonding region of the driving backplate very well.

In some embodiments, the structure of the second insulation layer is completely the same as that of the insulation layer, that is, the second insulation layer includes a first film layer and a second film layer sequentially arranged away from the base substrate. Materials of the film layers of the second insulation layer and the manufacture process of the second insulation layer are completely the same as those of the insulation layer, which will not described herein again.

In some embodiments, the method for manufacturing the driving backplate further includes step S6 of soldering the light source and the light source driving circuit to the driving backplate after step S5. The light sources are transferred to the driving backplate after step S5 through a mass transfer process, and then the positive and the negative electrodes of the light source are soldered to the first electrode and the second electrode on the driving backplate by a reflow soldering process. The signal terminals of the light source driving circuit are soldered to the third electrodes on the driving backplate through a reflow soldering process.

In some embodiments, the reflow soldering process includes forming a solder on the electrode structure, melting the solder at a high temperature above 200° C. when the electrode of the light source is soldered to the electrode structure on the driving backplate; and then, cooling and solidifying the melted solder so as to achieve the soldering of the upper and lower electrodes.

In some embodiments, the method for manufacturing the driving backplate further includes: cutting the driving backplate undergoing above steps to form a specified shape; and bonding and connecting the bonding electrodes to the flexible circuit board in the bonding region of the driving backplate.

The manufacture process of the structures on the driving backplate in the embodiment is not limited to the above-mentioned processes, and other relatively mature processes may also be adopted.

An embodiment of the present disclosure further provides a display module, which includes the driving backplate in the above embodiment.

In the embodiment, the driving backplate may directly display images by controlling the light sources disposed thereon to be turned on or turned off.

Figure 12:
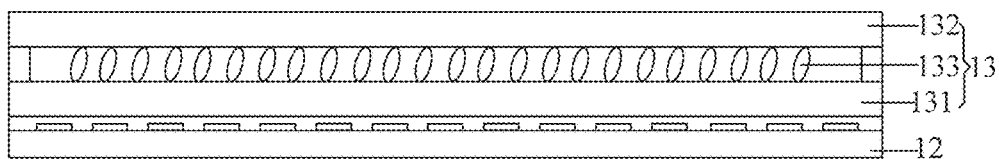
FIG. 12 is a schematic cross-sectional view showing a structure of a display module according to an embodiment of the present disclosure.

An embodiment of the present disclosure further provides a display module, as shown in FIG. 12, the display module includes the driving backplate 12 in the above embodiment, and further includes a liquid crystal cell 13. The liquid crystal cell 13 includes an array substrate 131 and a color filter substrate 132. The array substrate 131 and the color filter substrate 132 are aligned and assembled to form a cell gap, and the liquid crystal 133 is filled in the cell gap. The driving backplate 12 is disposed on a side of the array substrate 131 away from the color filter substrate 132, and the driving backplate 12 provides backlight for the liquid crystal cell 13.

Referring to FIG. 1 and FIG. 2, the driving backplate has a plurality of lamp regions 14 arranged in an array. The lamp regions 14 are in one-to-one correspondence with display units 16 composed of a fixed number of pixels 15. Four to twelve groups of three-color lamp beads 17, such as red, green and blue lamp beads, or four to twelve white lamp beads 17 are uniformly distributed in each of the lamp regions 14, and four to twelve groups of lamp beads or four to twelve lamp beads 17 are connected in series in each of the lamp regions 14. A plurality of light source driving circuits are arranged on the driving backplate. The plurality of light source driving circuits are in one-to-one correspondence with the display units 16, the light source driving circuits are respectively electrically connected to the pixel driving circuits in the display units 16, and meanwhile the light source driving circuits are also electrically connected to the positive electrodes and the negative electrodes of the lamp beads connected in series in the lamp region 14. That is, one light source driving circuit is configured to drive one display unit 16 to display, and simultaneously drive the lamp beads in the corresponding lamp region 14 to be turned on or turned off. A control system on the peripheral printed circuit board controls the light source driving circuits to provide input control signals for the lamp beads 17 in the lamp regions 14 and the display units 16, so that the driving backplate provides backlight for the liquid crystal cell to drive the display module to display.

The display module provided by the embodiment of the present disclosure may be any product or component with a display function, such as an LCD panel, an LCD television, a display, a mobile phone, a navigator and the like.

It should be understood that the above implementations are merely exemplary embodiments for the purpose of illustrating the principles of the present disclosure, however, the present disclosure is not limited thereto. It will be apparent to one of ordinary skill in the art that various changes and modifications can be made without departing from the spirit and essence of the present disclosure, which are also to be regarded as the scope of the present disclosure.

What is claimed is:

1. A driving backplate comprising a base substrate, and an insulation layer and a plurality of conductive structures on the base substrate, the insulation layer insulating the plurality of conductive structures from each other, wherein
   each of the plurality of conductive structures comprises a first conductive layer and a second conductive layer stacked sequentially along a direction away from the base substrate, and at least one portion of a region in which the first conductive layer is in contact with the second conductive layer comprises a flat contact region,
   an opening is at a position of the insulation layer corresponding to the conductive structure, an edge of the opening in the insulation layer is between the first conductive layer and the second conductive layer and is correspondingly in edge regions of the first conductive layer and the second conductive layer, and
   an orthographic projection of the opening on the base substrate overlaps an orthographic projection, on the base substrate, of the flat contact region where the first conductive layer is in contact with the second conductive layer,
   the plurality of conductive structures are arranged at intervals along a straight line direction in a non-display region, with the conductive structures at both ends of the plurality of conductive structures along the straight line direction being floating,
   the insulation layer comprises a first film layer and a second film layer stacked sequentially away from the base substrate,
   the driving backplate further comprises a dummy bonding terminal, the dummy bonding terminal being between the floated conductive structure at the end of the plurality of conductive structures and the remaining conductive structures and comprising a first opening in the second film layer of the insulation layer and the first film layer of the insulation layer exposed in the first opening.

2. The driving backplate of claim 1, wherein
the edge of the opening in the insulation layer is attached to a horizontal contact surface in the flat contact region at which the first conductive layer is in contact with the second conductive layer and forms a slope angle in a range from 25° to 70° with respect to the horizontal contact surface to which the edge of the opening in the insulation layer is attached, and
an edge of the second conductive layer is attached to a slope surface of the edge of the opening.

3. The driving backplate of claim 2, wherein
the insulation layer and the plurality of conductive structures are on a same side of the base substrate, and
a difference between a thickness, along a direction away from the base substrate, of the insulation layer and a thickness, along a direction away from the base substrate, of plurality of conductive structures is in a range from 0 μm to 0.5 μm.

4. The driving backplate of claim 3, wherein
the conductive structure further comprises a protective layer on a side of the second conductive layer away from the base substrate, and
the protective layer encapsulates the second conductive layer.

5. The driving backplate of claim 4, wherein
the first conductive layer comprises a first sub-layer and a second sub-layer stacked in sequence along a direction away from the base substrate, and
the second sub-layer encapsulates the first sub-layer.

6. The driving backplate of claim 5, wherein
each of an orthographic projection, on the base substrate, of an edge of the first sub-layer, an orthographic projection, on the base substrate, of an edge of the second conductive layer, an orthographic projection, on the base substrate, of an edge of the second sub-layer, and an orthographic projection, on the base substrate, of an edge of the protective layer is at a periphery of an orthographic projection, on the base substrate, of the opening, and
the edge of the first sub-layer, the edge of the second conductive layer, the edge of the second sub-layer, and the edge of the protective layer are sequentially arranged along a direction from an inside of the orthographic projection of the opening to an outside of the orthographic projection of the opening.

7. The driving backplate of claim 1, wherein
a width direction of the plurality of conductive structures is parallel to the straight line direction along which the plurality of conductive structures are arranged, and
along the width direction of the plurality of conductive structures, a size of the flat contact region where the first conductive layer is in contact with the second conductive layer is in a range from 50 μm to 100 μm.

8. The driving backplate of claim 1, wherein
the first film layer comprises an inorganic insulation material, and
the second film layer comprises an organic resin material.

9. A display module comprising the driving backplate of claim 1.

10. A method for manufacturing a driving backplate, comprising:
forming an insulation layer and a plurality of conductive structures on a base substrate; the insulation layer insulating the plurality of conductive structures from each other;
forming the plurality of conductive structures comprises sequentially forming a first conductive layer and a second conductive layer, such that the first conductive layer and the second conductive layer are stacked along a direction away from the base substrate, and at least one portion of a region in which the first conductive layer is in contact with the second conductive layer comprises a flat contact region;
forming the insulation layer comprises forming an opening at a position of the insulation layer corresponding to the conductive structure, such that an edge of the opening in the insulation layer is located between the first conductive layer and the second conductive layer and is correspondingly in edge regions of the first conductive layer and the second conductive layer; wherein
an orthographic projection of the opening on the base substrate overlaps an orthographic projection, on the base substrate, of the flat contact region in which the first conductive layer is in contact with the second conductive layer,
the plurality of conductive structures are arranged at intervals along a straight line direction in a non-display region, with the conductive structures at both ends of the plurality of conductive structures along the straight line direction being floating,
forming the insulation layer further comprises forming a first film layer and a second film layer stacked sequentially away from the base substrate,
the method further comprises forming a dummy bonding terminal such that the dummy bonding terminal is between the floated conductive structure at the end of the plurality of conductive structures and the remaining conductive structures and comprises a first opening in the second film layer of the insulation layer and the first film layer of the insulation layer exposed in the first opening.

11. The method of claim 10, comprising:
forming the first conductive layer of the plurality of conductive structures on the base substrate;
forming the insulation layer on the base substrate;
forming the opening at the position of the insulation layer corresponding to the first conductive layer, such that the edge of the opening is attached to a horizontal contact surface on which the first conductive layer is in contact with the second conductive layer in flat contact region; and
forming the second conductive layer of the plurality of conductive structures on the base substrate; wherein
the method further comprises: forming a protective layer for the plurality of conductive structures on the base substrate, such that the protective layer encapsulates the second conductive layer.

12. A display module comprising the driving backplate of claim 2.

13. A display module comprising the driving backplate of claim 3.

* * * * *